(12) United States Patent
Kawamata et al.

(10) Patent No.: US 9,073,154 B2
(45) Date of Patent: Jul. 7, 2015

(54) FLUX FOR LEAD-FREE SOLDER AND SOLDERING METHOD

(75) Inventors: Yuji Kawamata, Haga-gun (JP); Takashi Hagiwara, Moka (JP); Hiroyuki Yamada, Obu (JP); Kazuyuki Hamamoto, Gamagori (JP)

(73) Assignees: Senju Metal Industry Co., Ltd., Tokyo (JP); Denso Corporation, Kariya-shi (JP)

( * ) Notice: Subject to any disclaimer, the term of this patent is extended or adjusted under 35 U.S.C. 154(b) by 684 days.

(21) Appl. No.: 12/311,976

(22) PCT Filed: Dec. 12, 2007

(86) PCT No.: PCT/JP2007/073926
§ 371 (c)(1),
(2), (4) Date: Aug. 4, 2009

(87) PCT Pub. No.: WO2008/072654
PCT Pub. Date: Jun. 19, 2008

(65) Prior Publication Data
US 2009/0308496 A1 Dec. 17, 2009

(30) Foreign Application Priority Data
Dec. 12, 2006 (JP) ................................ 2006-335173

(51) Int. Cl.
*B23K 35/362* (2006.01)
*B23K 35/26* (2006.01)
*B23K 35/36* (2006.01)
*B23K 35/38* (2006.01)
*H05K 3/34* (2006.01)

(52) U.S. Cl.
CPC ............. *B23K 35/362* (2013.01); *B23K 35/262* (2013.01); *B23K 35/3613* (2013.01); *B23K 35/3618* (2013.01); *B23K 35/383* (2013.01); *B23K 2203/12* (2013.01); *H05K 3/3489* (2013.01)

(58) Field of Classification Search
USPC ....................................................... 148/23, 26
IPC ....................................... B23K 35/3612,35/362
See application file for complete search history.

(56) References Cited

U.S. PATENT DOCUMENTS

| | | | | |
|---|---|---|---|---|
| 2,740,193 | A | * | 4/1956 | Pessel ........................ 228/180.1 |
| 4,196,024 | A | * | 4/1980 | Kenyon .......................... 148/23 |
| 2001/0042775 | A1 | * | 11/2001 | Arora et al. ................ 228/180.1 |
| 2002/0046627 | A1 | | 4/2002 | Amita et al. ..................... 75/252 |
| 2003/0221748 | A1 | * | 12/2003 | Arzadon et al. ................ 148/23 |
| 2004/0209451 | A1 | | 10/2004 | Kukimoto et al. ............ 438/612 |
| 2005/0159509 | A1 | * | 7/2005 | Uchida et al. ................ 523/210 |

FOREIGN PATENT DOCUMENTS

| | | |
|---|---|---|
| EP | 1348513 | 10/2003 |
| EP | 1439025 | 7/2004 |
| EP | 1995016 | 11/2008 |
| JP | 61242790 | 10/1986 |
| JP | 63090390 | 4/1988 |
| JP | 63115693 | 5/1988 |
| JP | 5212584 | 8/1993 |
| JP | 7088687 | 4/1995 |
| JP | 2003225795 | 8/2003 |
| JP | 2006181635 | 7/2006 |

* cited by examiner

*Primary Examiner* — Weiping Zhu
(74) *Attorney, Agent, or Firm* — Michael Tobias

(57) ABSTRACT

A soldering flux which is suitable as a no-clean post flux in flow soldering and which can prevent the formation of whiskers which tends to occur when soldering electronic parts to a printed circuit board using a lead-free solder (such as Sn-3.0Ag-0.5Cu) having a higher Sn content and a higher melting point than the eutectic solder contains, in addition to a rosin as a base resin and an activator, 0.2-4 mass % of at least one compound selected from acid phosphate esters and derivatives thereof. The formation of whiskers can be more effectively prevented by carrying out soldering in a nitrogen atmosphere.

17 Claims, 1 Drawing Sheet

FLUX FOR LEAD-FREE SOLDER AND SOLDERING METHOD

TECHNICAL FIELD

This invention relates to a flux for soldering which is suitable as a post flux used in soldering by the flow soldering method with a lead-free solder to mount electronic parts on a printed circuit board. A flux according to the present invention is a no-clean type flux which does not require cleaning of flux residue after soldering. In addition, it can prevent the formation of whiskers which have become a problem in soldering with lead-free solders of a tin alloy having a high tin content.

BACKGROUND ART

Securing and electrical connection of electronic parts in electronic equipment as performed when electronic parts are mounted on a printed circuit board are generally carried out by soldering, which is the most advantageous method from the standpoints of cost and reliability.

Methods which are generally employed for this type of soldering are the flow soldering method in which soldering is carried out by contacting a printed circuit board and electronic parts with molten solder, and the reflow soldering method in which soldering is carried out by reheating solder in the form of a solder paste, solder preforms, or solder balls in a reflow furnace.

In such soldering, a flux is employed as an auxiliary agent in order to facilitate adhesion of solder to a printed circuit board and electronic parts. Flux performs many actions including the following (1)-(3).

(1) Metal surface cleaning: Flux chemically removes oxide films on the metal surfaces of a printed circuit board and electronic parts, thereby cleaning the surfaces so that soldering is possible.

(2) Preventing re-oxidation: During soldering, flux covers a metal surface which has become clean and isolates the surface from contact with oxygen to prevent re-oxidation of the metal surface due to heating.

(3) Surface tension reduction: Flux reduces the surface tension of molten solder and increases the wettability of the metal surface by molten solder.

Flux can be generally classified as inorganic fluxes which use a metal salt or an inorganic acid, water soluble fluxes which use a water soluble compound such as polyethylene glycol as a base component, and resin-based fluxes which use a resin such as rosin as a base component. In addition to a resin which is used as a base component, resin-based fluxes contain at least one activator selected from organic acids, organic acid salts of an amine, and hydrohalide salts of an amine, and optionally a solvent as required to facilitate application and transfer of the flux.

Inorganic fluxes and water soluble fluxes are highly corrosive. Therefore, after soldering, it is necessary to perform cleaning in order to remove any remaining flux residue.

With a resin-based flux, a resin such as rosin which is contained in the flux as a base component is electrically insulating. After soldering by heating, flux residue, the main component of which is derived from the resin which is the base component of the flux, remains. This flux residue has good electrically insulating properties at room temperature and is not corrosive, and it covers and protects soldered portions. Therefore, it is possible to use a resin-based flux without performing cleaning.

However, in an environment with a high temperature close to 100° C. and a high humidity, the flux residue softens and becomes semi-liquid. In such a state, soldered portions are uncovered and humidity corrodes the solder, so the insulation resistance deteriorates. Therefore, a printed circuit board which is mounted on a part such as an automotive part which has the possibility of being exposed to a high-temperature, high-humidity environment is typically subjected to conformal coating with a silicone resin, an acrylic resin, an epoxy resin, or the like after the printed circuit board is cleaned after soldering. In this case, the presence of flux residue worsens the adhesion of the resulting coating, so the printed circuit board is cleaned after soldering.

Although a resin-based flux has the problem that the insulating properties of flux residue deteriorate in a high-temperature environment, flux residue itself is essentially harmless. Therefore, a no-clean type flux which does not require removal of flux residue by cleaning has been developed and actually used. Of course, a no-clean flux is preferable from the standpoint of decreasing the burden on the environment, and it is also advantageous from a cost standpoint. However, a no-clean flux often has low activity.

In both flow soldering and reflow soldering, soldering is increasingly being carried out in a nitrogen atmosphere. Oxidation does not readily take place in a nitrogen atmosphere, so a flux having low activity can be used. Accordingly, soldering in a nitrogen atmosphere is particularly suitable for no-clean fluxes.

Two types of fluxes are used in soldering of printed circuit boards by flow soldering, namely, a preflux which is applied to a circuit board immediately after it is manufactured in order to protect the surface of copper foil interconnection on the printed circuit board, and a post flux which is applied to portions to be soldered at the time of soldering either before or after mounting of electronic parts on the printed circuit board. Preflux usually does not contain an activator.

JP H05-212584 A proposes a solder paste comprising a flux and a solder powder in which an acid phosphate ester which is a dialkyl acid phosphate or a mixture of it and a monoalkyl acid phosphate is included in an amount of 5-40 parts by mass with respect to 100 parts by mass of flux. That solder paste is of a type in which flux residue remaining after soldering is cleaned off with an organic solvent. In addition, the solder powder is not a lead-free solder.

JP 2006-181635 A discloses a solder paste formed by mixing a lead-free solder powder and a flux containing an organic halide, in which the flux contains an organophosphorus compound in order to prevent blackening of soldered portions caused by the organic halide. Phosphates which are exemplified as the organophosphorus compound are neutral phosphates such as a tri-alkyl or -aryl phosphate.

Solders which have been commonly used from long in the past have been Sn—Pb alloys and particularly a Sn—Pb eutectic alloy (Sn-37Pb, melting point of 183° C.), which is simply called eutectic solder. However, due to the harmfulness of Pb, the use of Pb is now regulated on a global scale. Therefore, the use of lead-free solders which do not contain any Pb is recommended in soldering of printed circuit boards.

Lead-free solder is typically a Sn based alloy having Sn as a main component. Lead-free solders which have been proposed thus far include Sn—Ag—Cu based alloys, Sn—Cu based alloys, Sn—Ag based alloys, Sn—Bi based alloys, Sn—Zn based alloys, and the like. Except for Sn—Bi based alloys which have an extremely low melting point of at most 150° C., almost all of these lead-free solders have a high Sn content of at least to 90 mass %.

In this description, a Sn—Ag—Cu based lead-free solder, for example, means a Sn—Ag—Cu ternary alloy and alloys in which minute amounts of added element or elements are added to this ternary alloy. The same is true with respect to other " . . . based" lead-free solders.

One lead-free solder which is currently actually used is Sn-3Ag-0.5Cu alloy (solidus temperature of 217° C. and liquidus temperature of 220° C.), but it has a soldering temperature of roughly 40° C. higher than that of the eutectic solder.

Patent Document 1: JP H05-212584 A
Patent Document 2: JP 2006-181635 A

DISCLOSURE OF INVENTION

With the trend away from use of Sn—Pb solders represented by the eutectic solder towards the use of lead-free solders, the formation of whiskers in soldered portions, which was hardly ever experienced with Sn—Pb solders, has become a problem. These whiskers are hair-shaped crystals of Sn, which may grow to a diameter of 2 am and a length of around 2-3 mm (see FIG. 1).

The formation of such whiskers has been well known in electroplating with tin. The causes of the formation of Sn whiskers are thought to include the physical factor that while two to three years pass after electroplating, metal molecules are pushed out by stresses remaining in the plated coating and grow to the shape of whiskers, and the chemical factor that metal particles and moisture and the like are adsorbed at portions where rubbish or dust has adhered and promote corrosion on the surface.

Whiskers develop in soldered portions formed by flow soldering or reflow soldering using lead-free solder, although not with the same frequency as with electroplated tin coatings. If whiskers, which are electrically conductivity, develop in the soldered portions of electronic parts in electronic equipment, the whiskers can cause shorting of electric circuits and cause the equipment to malfunction. Whiskers fall off when they grow to a certain length, and because they are very small and light and float in the air, they often cause problems in unexpected locations. Accordingly, it is desirable to prevent the formation of whiskers in soldering of electronic parts with lead-free solder.

However, there have been no studies of how to prevent formation of whiskers observed in soldered portions formed by lead-free solder. The present invention provides technology which can prevent the formation of whiskers in soldered portions formed by lead-free solder, thereby making it possible to prevent shorting of electronic circuits of printed circuit boards caused by whiskers and increase the lifespan of electronic equipment.

A more specific object of the present invention is to provide a flux for lead-free solder which can prevent the formation of whiskers even when the flux is used as a no-clean post flux for soldering of printed circuit boards by flow soldering.

The present inventors found that when electronic parts are soldered on a printed circuit board using a lead-free solder, the amount of whiskers which develop in the soldered portions of the printed circuit board varies with the type of flux, and that the formation of whiskers can be suppressed by adding a small amount of an acid phosphate ester to the flux.

Thus, the present invention is a no-clean resin-based flux for lead-free solder characterized by containing 0.2-4 mass % of at least one compound selected from acid phosphate esters and derivatives thereof, in addition to a resin as a base component of the flux and an activator. The flux preferably further contains a polar solvent.

From another standpoint, the present invention is a soldering method characterized by carrying out soldering for mounting parts on a printed circuit board using a lead-free solder using a flux containing 0.2-4 mass % of at least one compound selected from acid phosphate esters and derivatives thereof in addition to a resin as a base component of the flux, an activator, and a polar solvent without performing cleaning after soldering.

In the present invention, the phosphoric acid which constitutes an acid phosphate ester (phosphoric ester) means any oxyacid of phosphorus including orthophosphoric acid, phosphonic acid (phosphorous acid), and phosphinic acid (hypophosphorous acid or phosphonous acid). Accordingly, acid phosphate esters include acid orthophosphoric esters (acid phosphates), acid phosphonic esters (acid phosphonates), and acid phosphinic esters (acid phosphinates). A preferred acid phosphate is an acid phosphonate or an acid phosphinate.

The base component is the constituent present in the flux in the largest amount except for the solvent. A flux according to the present invention is a resin-based flux having a resin as the base component. The resin which is the base component is preferably one or more substances selected from rosin and rosin derivatives.

In the field of Sn electroplating, heat treatment of a plated coating under conditions such as 150° C. for 20 minutes is widely carried out after plating as a countermeasure against the formation of Sn whiskers. An electroplated coating is formed by deposition of metal particles which are precipitated due to plating. There are gaps between metal particles, and the formation of whiskers is suppressed by leveling the coating surface by heat treatment. Accordingly, heat treatment is aimed at suppressing the formation of whiskers primarily caused by physical factors.

In soldered portions formed by flow soldering or reflow soldering, solder is completely melted and then solidified. Even though the solder surface is level, the formation of whiskers is observed. These whiskers are thought to be produced by chemical causes.

The reason why whiskers more easily form in soldered portions formed by a lead-free solder than with a conventional Sn—Pb solder are thought to be related to the following circumstances.

A lead-free solder has a higher content of Sn, which is an active element highly susceptible to oxidation.

A lead-free solder does not have good wettability as molten solder. In order to improve wettability, a flux for lead-free solder contains larger amounts of activator agents, and such a flux produces various chemical reactions at the time of soldering.

A lead-free solder such as a Sn—Ag—Cu based solder has a high soldering temperature.

Accordingly, the causes of the formation of whiskers with a lead-free solder are different from the causes of whiskers of Sn-plated coatings, which are primarily physical causes. However, the phenomenon that metal (Sn) is pushed out in the form of whiskers due to local multi-axis compressive forces is the same.

The following mechanism is conceivable as the mechanism of the formation of whiskers which develop in soldered portions of lead-free solder on a printed circuit board. When Sn contained in lead-free solder in soldered portions is oxidized into $SnO_2$ due to humidity or halogen-containing components present in flux residue, volume expansion takes place because $SnO_2$ has a lower density than Sn. At the time of soldering, $Cu_3Sn$, which is a Sn—Cu intermetallic compound, forms at the interface of solder and Cu lands of printed circuit boards. Intermetallic compounds are also formed by the reaction of Sn with Ag, Fe, and Ni contained in electronic parts. These intermetallic compounds have a higher density compared to Sn, $SnO_2$, Cu, and the like, so they generate a contractive force. In this manner, multi-axis compressive stresses act on soldered portions of a printed circuit board to cause metals to be pushed out in the form of hairs and form whiskers. If the whiskers fall off, they cause shorting of electronic circuits.

When a resin-based flux which contains a resin such as rosin (pine resin) as a base component is used in soldering, the solvent in the flux vaporizes during soldering, while pine resin and an activator, which both have active functional groups, react with oxides present either in solder or in the periphery thereof and remove the oxides. Components in the flux which do not participate in this action and substances formed by the reaction with oxides remain in the periphery of solder as flux residue after soldering. The main component of the flux residue is material resulting from degeneration of the base component (resins such as pine resin) due to heat. This flux residue is electrically insulating and repels moisture. Therefore, even if the flux residue is not removed by cleaning after soldering, it does not have an adverse effect on the reliability of electronic equipment, and resin-based fluxes can be used as no-clean fluxes.

The surface of flux residue formed from a resin-based flux is porous and can easily capture water molecules. Since resins such as pine resin are not permeable to water, the captured water molecules do not permeate to the interior of the flux residue. However, in a high-temperature, high-humidity environment, the flux residue and the water molecules are always contacting each other.

Activators in flux are decomposed by heat during soldering. For example, a hydrohalide salt of an amine or an organic halide used as an activator decomposes to form a free halogen molecule, which reacts with oxides to remove them. However, depending on the heating conditions at the time of soldering, the activators may not be completely decomposed and remain in flux residue. The undecomposed activators remaining in the flux residue may oxidize Sn in solder into its oxide ($SnO_2$) in the presence of moisture and cause volume expansion.

As described above, whiskers are formed primarily by oxidation of Sn in solder, so their formation is readily influenced by environmental factors such as humidity. If solder forms an alloy layer at the interface with a substrate due to heat at the time of soldering, the alloy layer itself becomes a barrier to the solder and makes it difficult for further oxidation of Sn to take place.

With a conventional Sn—Pb solder, soldering was carried out at a temperature of approximately 215-230° C., which is approximately 30° C. higher than the melting point (approximately 183° C.) of the solder. The melting point of currently used Sn—Ag—Cu based lead-free solder is approximately 220° C. However, the heat resistance of electronic parts has not changed significantly, so the soldering temperature is often set to 20-25° C. higher than the melting temperature of the solder. Therefore, the time for which portions to be soldered are wet by molten solder is shortened, and growth of an alloy layer during soldering is limited. This fact is thought to be one reason why whiskers have become more common since lead-free solders have begun to be used.

One method which is effective at preventing the formation of whiskers is to clean a printed circuit board so as to remove flux residue. Metals which produce whiskers can then be chemically or physically coated so that moisture or foreign matter does not adhere thereto. Previously-mentioned conformal coating is one example of such coating. However, environmental considerations impose a limit on the cleaning solvents which can be used when removing flux residue by cleaning. In addition, performing resin coating after soldering increases costs, so it is difficult to apply resin coating to all printed circuit boards. If cleaning and resin coating can be made unnecessary, the costs of printed circuit boards can be markedly decreased.

In the present invention, a small amount of an acid phosphate ester is contained in flux in order to prevent the formation of whiskers without performing cleaning to remove flux residue. An acid phosphate can react with Sn, which is the base component of lead-free solder, to form a complex with Sn, thereby preventing oxidation of Sn and its reaction to form an intermetallic compound and thus preventing the formation of whiskers. Among compounds which form a complex with Sn, it was found that acid phosphates are the most effective at preventing the formation of whiskers.

Since the formation of a metal complex is achieved by sterical coordination of molecules of a compound serving as a ligand around the metal, it has not only a chemical protective effect but also has a physical protective effect. Due to the formation of a steric configuration, monovalent metals such as Ag and Cu form a complex more easily, and complex-forming reagents (ligands) which can form a complex with multivalent metals such as Sn are limited. Specific examples of such reagents are acid phosphates as well as dicarboxylic acids, 8-quinolinol, and diphenylthiocarbazone. However, in order to suppress formation of whiskers on a printed circuit board after soldering, the reagent must form a complex with Sn which is maintained even after soldering. Whiskers easily form due to moisture in the environment, so it is necessary that the reagent which is used not readily dissolve in water.

Because flux serves to improve solderability, components added to flux must not impair solderability or deteriorate insulating resistance after soldering. Acid phosphates satisfy all of these requirements.

When a flux according to the present invention is used for soldering with a lead-free solder such as for soldering of electronic parts to a printed circuit board, the formation of whiskers on soldered portions can be prevented without carrying out cleaning after soldering in either flow soldering or reflow soldering. Accordingly, the flux is particularly useful as a post flux in flow soldering, but it can also be used in reflow soldering, and it can be mixed with solder powder to prepare a solder paste for use in reflow soldering.

The formation of whiskers is thought to be prevented by the fact that even when the flux is heated to the usual soldering temperature for lead-free solder of 230-260° C., the acid phosphate component in the flux remain in flux residue and can prevent the oxidation of Sn.

BRIEF EXPLANATION OF THE DRAWINGS

FIG. 1 is an optical photomicrograph showing the formation of whiskers.

BEST MODE FOR CARRYING OUT THE INVENTION

A flux according to the present invention contains, in addition to a resin as a base component and an activator, at least one compound selected from acid phosphate esters and derivatives thereof (collectively referred to below as acid phosphates). In addition, it normally contains a solvent. The components of the flux and the proportions thereof may be basically the same as for resin-based fluxes which have conventionally been used except for the presence of an acid phosphate. The components will be briefly explained below.

The resin which is the base component of a flux is a non-water soluble natural or synthetic resin. Preferred resins are one or more substances selected from rosin (pine resin) and its derivatives. Examples of rosin derivatives are modified rosins (such as acrylic acid modified rosins), hydrogenated rosins, polymerized rosins, and disproportionated rosins.

The activator may be one or more substances selected from organic acids, hydrohalide salts of amines, organic acid salts of amines, diols, and the like. Examples of an organic acid are adipic acid, sebacic acid, p-tert-butylbenzoic acid, and the like. Examples of hydrohalide salts of amines are hydrochlorides, hydrobromides, and borohydrofluorides of a wide variety of amines including various mono-, di-, and tri-alkyl amines, cyclohexylamine, aromatic amines such as aniline, heterocyclic amines such as pyridine, diphenylguanidine, and the like. Hydrobromides and borohydrofluorides are preferable to hydrochlorides. Organic acid salts of amines are salts of the above-described amines and organic acids. A preferred diol is a halogenated diol such as 2,3-dibromo-2-butene-1,4-diol.

The amount of an activator (the total amount when there are two or more) with respect to the resin serving as the base component is preferably in the range of 3-40 mass % and more preferably 5-20 mass The flux of the present invention contains 0.2-4 mass % of at least one substance selected from acid phosphates and derivatives thereof.

An acid phosphate is an acidic ester of an oxyacid of phosphorus having the general formula $P(=O)H_x(OH)_{3-x}$ which includes orthophosphoric acid (x=0), phosphonic acid (x=1), and phosphinic acid (x=2). Examples of derivatives of acid phosphates are acidic esters of phosphoric acid derivatives of the above formula in which H is replaced by an organic group (such as an alkyl or aryl group).

Orthophosphoric acid $[P(=O)(OH_3)]$ is a tribasic acid. Phosphonic acid $[P(=O)H(OH)_2]$ also becomes a tribasic acid by taking the form of its tautomer represented by $P(OH)_3$. Similarly, phosphinic acid $[P(=O)H_2(OH)]$ becomes a dibasic acid by taking the form of its tautomer represented by $P(H)(OH)_2$. Accordingly, possible forms of acid phosphates include mono- and di-esters of orthophosphoric acid, mono- and di-esters of phosphonic acid, and monesters of phosphinic acid.

Among acid phosphates, acid orthophosphoric esters (acid phosphates) disclosed in Patent Document 1 do not readily decompose under heating during soldering, and a large amount of flux remains so that they have an excellent effect of preventing the formation of whiskers. However, compared to acid phosphonates and phosphinates, they tend to cause the insulation resistance of flux residue remaining after soldering to decrease slightly, and it is necessary to take into consideration this effect in the case of high-density electronic equipment. Therefore, an acid phosphate is preferably an acid phosphonate or an acid phosphinate, and an acid phosphonate is particularly preferred.

Ester groups of acid phosphates are preferably ester groups derived from alkyl groups having at most 16 carbon atoms. Specific examples of acid phosphates which can be used in the present invention include, not limited thereto, di(2-ethylhexyl) phosphonate, diethyl (p-methylbenzyl)phosphonate, di(isodecyl) phosphonate, mono(2-ethylhexyl) phosphinate, and di(2-ethylhexyl) phosphate.

Acid phosphates prevent the oxidation of Sn by being adsorbed on the solder surface. In addition, they remain in flux residue after soldering and continue to contact the solder surface, whereby their effect of preventing oxidation is lasting. Therefore, if the content of acid phosphates in the flux is small, they cannot exhibit their effect, while if the content is too large, the insulating resistance of the printed circuit board after soldering deteriorates. For these reasons, the content of an acid phosphate in the flux is made 0.2-4 mass %. A more preferred content is 0.2-2 mass %.

The remainder of the flux is a solvent. The type and amount of solvent is selected in accordance with the manner of use of the flux, but polar solvents and particularly polar organic solvents such as alcohols and ketones are preferred. Such polar organic solvents serve to improve the wettability of molten solder at the time of soldering. When flux is used as post flux in flow soldering of a printed circuit board, the polar solvent is preferably one which is highly volatile and has low viscosity. Examples of such a polar solvent are lower alcohols such as isopropyl alcohol (isopropanol), ethanol, and methanol.

A post flux is applied using a spray fluxer or a foam fluxer, for example. A preferred example of the proportion (mass %) of each of the components in a post flux applied by a spray fluxer is as follows:

base resin: 5-15%, more preferably 8-12%
activator: 0.5-3%, more preferably 1-2.5%
acid phosphate: 0.2-4%, more preferably 0.2-2%
solvent: 70-99%

When application is performed using a foam fluxer, it is difficult to perform foaming if the flux has a high solvent content. Therefore, the content of the solvent is more limited than when using a spray fluxer, and normally it is 80-90%.

A resin-based flux according to the present invention can be used in reflow soldering or as a flux for flux cored wire solder. The effect of preventing the formation of whiskers in soldered portions can also be obtained in such cases. A flux for a flux cored wire solder usually contains substantially no solvent.

A resin-based flux according to the present invention can be used in the form of a solder paste by mixing it with solder powder, and in such cases, it also provides the effect of preventing the formation of whiskers. When the flux is used in a solder paste, the acid phosphate coats the solder powder and thereby suppresses oxidation of the solder powder, leading to a secondary effect at lengthening the storage period of the solder paste. However, in solder paste, the solder powder is highly reactive due to its fine particle size with a large surface area, and during storage before use for soldering, it contacts flux components. Therefore, the content of an acid phosphate in the flux is preferably made lower (such as at most 2% and more preferably at most 1%).

Since flux used in a solder paste is in the form of a paste, a high-viscosity solvent is used in the flux in a relatively small amount (such as at most 60 mass % of the flux). Examples of suitable solvents are alkylene glycols such as hexylene glycol, carbitols, and terpineols. An additive such as a thixotropic agent is usually added to the flux in order to adjust the viscosity of the flux.

The atmosphere of soldering may be air, but the effect of preventing the formation of whiskers is more marked if it is a nitrogen atmosphere. The purpose of soldering is not limited to soldering electronic parts to a printed circuit board, and a flux according to the present invention can be used for all types of soldering using a lead-free solder. As described above, flux residue containing an acid phosphate continues to exert an antioxidation effect on a lead-free solder after soldering. Therefore, no problems with respect to the reliability of solder occur even if cleaning is not carried out.

Present day printed circuit boards often have electronic parts mounted on both sides thereof. In this case, after carrying out soldering by reflow soldering on one side, flow soldering of the other side is sometimes carried out, and the post flux used in flow soldering is applied to a printed circuit board which has a heating history due to the reflow soldering. In such a situation as well, the post flux must continue to function as a flux. A resin-based flux according to the present invention can also satisfy this requirement.

EXAMPLES

A resin-based flux having a rosin-type resin as a base component was prepared by mixing the components shown in Table 1 in the indicated proportions, and testing was performed with respect to the formation of whiskers after soldering, the wettability of molten solder (zero cross time), and the insulation resistance of flux residue. The results of these tests are also shown in Table 1.

1. Formation of Whiskers

In order to simulate two-sided mounting of a printed circuit board by reflow soldering followed by flow soldering, a printed circuit board for testing for the formation of whiskers (a commercial product measuring 180×180 mm and having Cu lands) was first heated in a reflow furnace without mounting of parts thereon. The heating conditions were preheating at 160° C. for 1 minute and then main heating at 200° C. or above for 20 seconds (peak temperature of 240° C. for 5 seconds), which are typical temperatures for reflow soldering with lead-free solder.

Using an automatic soldering apparatus for flow soldering equipped with a wave soldering tank, this printed circuit board was subjected to application of the flux being tested with a spray fluxer and flow soldering under the following conditions to form bumps on the lands.

Soldering apparatus: SPF-300N2 manufactured by Senju Metal Industry Co., Ltd.,
Flux application: Spraying (coating amount: 0.6 ml/cm$^2$),
Solder: Sn-3.0Ag-0.5Cu (ECO™ solder M-705 manufactured by Senju Metal Industry Co., Ltd.),
Temperature of molten solder: 250° C.,
Preheating temperature of circuit board: 110° C.,
Conveyor speed: 1.2 m/minute,
Immersion time in molten solder: 5 seconds (double wave),
Atmosphere: Air or nitrogen atmosphere (oxygen content: 1000 ppm).

After soldering, the printed circuit board was allowed to cool in the same atmosphere as for soldering and returned to room temperature, after which it was placed into a thermo-hygrostat with the atmosphere of air at a temperature of 85° C. and a relative humidity of 85%. When 200 hours had elapsed, the printed circuit board for the whisker formation test was removed and returned to room temperature for 24 hours. At this time, the state of formation of whiskers was observed. The number of whiskers which developed after the test circuit board was placed in the thermo-hygrostat for 1000 hours is shown in Table 1.

2. Solder Wettability

An oxidized brass plate prescribed by JIS C 2600 was subjected to aging for 24 hours at a temperature of 85° C., and a relative humidity of 85% to prepare a test piece for a meniscograph test.

After application of the flux to be tested to this test piece, the zero cross time was measured by the meniscograph method under the following conditions:

Test apparatus: SAT-5100 solder checker manufactured by Rhesca Co., Ltd.,
Solder: Sn-3.0Ag-0.5Cu (ECO™ solder M705 manufactured by Senju Metal Industry Company, Ltd.),
Temperature of molten solder: 250° C.,
Immersion speed: 10 mm/second,
Duration of immersion: 10 seconds,
Immersion depth: 2 mm,
Flux application: Dip coating (a Petri dish was filled with flux to a depth of 4 mm, and a test piece was dipped therein for 5 seconds and then withdrawn),
Number of repetitions: 5 times (average value shown in the table).

3. Insulation Resistance of Flux Residue

This test was carried out in accordance with JIS Z 3197. A commercial printed circuit board measuring 180 mm×180 mm and having Cu lands was coated with 0.2 ml of a flux to be tested, and it was heated by only preheating at 100° C. in air using an automatic flow soldering apparatus. The printed circuit board was then placed into a thermo-hygrostat with air atmosphere at a temperature of 85° C. and a relative humidity of 85%, and the insulation resistance of the printed circuit board was measured at an insulated portion of the board after 3 hours as an initial value and after 168 hours.

TABLE 1

| | | Examples | | | | | | |
|---|---|---|---|---|---|---|---|---|
| Run No. | | 1 | 2 | 3 | 4 | 5 | 6 | 7 |
| Flux compo-nents | Acrylic acid-modified rosin | 4 | 4 | 4 | 4 | 4 | 4 | 4 |
| | Hydrogenated rosin | 6 | 6 | 6 | 6 | 6 | 6 | 6 |
| | Diphenylguanidine HBr | 0.2 | 0.2 | 0.2 | 0.2 | 0.2 | 0.2 | 02 |
| | 2,3-Dibromo-2-butene-1,4-diol | 0.3 | 0.3 | 0.3 | 0.3 | 0.3 | 0.3 | 0.3 |
| | p-Tert-butylbenzoic acid | 0.5 | 0.5 | 0.5 | 0.5 | 0.5 | 0.5 | 0.5 |
| | Cyclohexylamine borohydrofluoride | 0.3 | 0.3 | 0.3 | 0.3 | 0.3 | 0.3 | 0.3 |
| | Di(2-ethyhexyl) phosphonate | 0.2 | 1 | 4 | | | | |
| | Diethyl (p-methylbenzyl)phosphonate | | | | 1 | | | |
| | Di(isodecyl) phosphonate | | | | | 1 | | |
| | Mono-2-ethylhexyl phosphinate | | | | | | 1 | |
| | Di(2-ethylhexyl) phosphate | | | | | | | 1 |
| | 9,10-Dihydro-9-oxa-10-phospha-phenanthlene-10-oxide | | | | | | | |
| | Rosin ester | | | | | | | |
| | Hexylene glycol | | | | | | | |
| | Hydrogenated castor oil | | | | | | | |
| | Isopropyl alcohol (IPA) | rem | rem | rem | rem | rem | rem | rem |

TABLE 1-continued

| | | | | | | | | | |
|---|---|---|---|---|---|---|---|---|---|
| Test results | Number of whiskers formed | in air atmosphere | 10 | 4 | 3 | 10 | 11 | 7 | 10 |
| | | in nitrogen atmosphere | 2 | 0 | 0 | 2 | 3 | 2 | 1 |
| | Zero cross time (brass) | | 1.5 | 1.5 | 1.5 | 1.5 | 1.5 | 1.5 | 1.5 |
| | Insulation resistance of flux residue (Ω) | initial | $1 \times 10^9$ | $1 \times 10^9$ | $6 \times 10^8$ | $1 \times 10^9$ | $1 \times 10^9$ | $1 \times 10^9$ | $6 \times 10^8$ |
| | | after 168 hrs | $2 \times 10^{10}$ | $2 \times 10^{10}$ | $1 \times 10^{10}$ | $1 \times 10^{10}$ | $2 \times 10^9$ | $8 \times 10^9$ | $8 \times 10^9$ |
| | Remarks | | | | | | | | |

| | | | Comparative Examples | | | | | |
|---|---|---|---|---|---|---|---|---|
| | | Run No. | 8 | 9 | 10 | 11 | 12 | 13 |
| Flux components | Acrylic acid-modified rosin | | 4 | 4 | 4 | — | 4 | 4 |
| | Hydrogenated rosin | | 6 | 6 | 6 | — | 6 | 6 |
| | Diphenylguanidine HBr | | 02 | 0.2 | 02 | 2 | 02 | 0.2 |
| | 2,3-Dibromo-2-butene-1,4-diol | | 0.3 | 0.3 | 0.3 | | 0.3 | 0.3 |
| | p-Tert-butylbenzoic acid | | 0.5 | 0.5 | 0.5 | | 0.5 | 0.5 |
| | Cyclohexylamine borohydrofluoride | | 0.3 | 0.3 | 0.3 | | 0.3 | 0.3 |
| | Di(2-ethyhexyl) phosphonate | | | 0.1 | 8 | | | |
| | Diethyl (p-methylbenzyl)phosphonate | | | | | | | |
| | Di(isodecyl) phosphonate | | | | | | | |
| | Mono-2-ethylhexyl phosphinate | | | | | | | |
| | Di(2-ethylhexyl) phosphate | | | | | 15 | 15 | |
| | 9,10-Dihydro-9-oxa-10-phospha-phenanthlene-10-oxide | | | | | | | 1 |
| | Rosin ester | | | | | 46 | | |
| | Hexylene glycol | | | | | 33 | | |
| | Hydrogenated castor oil | | | | | 4 | | |
| | Isopropyl alcohol (IPA) | | rem | rem | rem | — | rem | rem |
| Test results | Number of whiskers formed | in air atmosphere | 34 | 20 | 4 | 20 | 8 | 25 |
| | | in nitrogen atmosphere | 15 | 12 | 0 | 15 | 2 | 15 |
| | Zero cross time (brass) | | 1.5 | 1.5 | 1.5 | 2 | 1.4 | 1.5 |
| | Insulation resistance of flux residue (Ω) | initial | $1 \times 10^9$ | $1 \times 10^9$ | $2 \times 10^7$ | $1 \times 10^7$ | $1 \times 10^7$ | $1 \times 10^9$ |
| | | after 168 hrs | $2 \times 10^{10}$ | $2 \times 10^{10}$ | $5 \times 10^8$ | $5 \times 10^8$ | $5 \times 10^8$ | $1 \times 10^{10}$ |
| | Remarks | | | | | Pat. Doc. 1 | | Pat. Doc. 2 |

From the results shown in Table 1, it can be seen that with the flux of Run No. 8 to which an acid phosphate was not added and the flux of Run No. 9 in which the added amount was less than 0.1 mass %, a large number of whiskers occurred after soldering. The conventional fluxes of Runs Nos. 11 and 13 had almost no effect of preventing the formation of whiskers.

In contrast, with the fluxes according to the present invention containing an acid phosphate in an amount of 0.2-4 mass % (Runs Nos. 1-7), the number of whiskers formed after soldering decreased. This effect was particularly marked in flow soldering in a nitrogen atmosphere. With these fluxes, the wettability of solder was good, and the insulation resistance after soldering could maintain a value of at least $1 \times 10^8$ ohms, which is a target value for leak defects of electronic equipment, initially as well as after passage of 168 hours.

However, for the flux of Run No. 10 in which the added amount of an acid phosphate exceeded 4 mass %, an initial value of insulation resistance of at least $1 \times 10^8$ ohms, which is a target value for leak defects of electronic equipment, could not be achieved. The insulation resistance for Runs Nos. 11 and 12 was also less than the target value.

The invention claimed is:

1. A non-water soluble resin-based flux for a lead-free solder having Sn as a main component, the flux comprising a resin selected from rosin, modified rosins, hydrogenated rosins, polymerized rosins, and disproportionated rosins as a base component, an activator, 0.2-4 mass % of at least one compound selected from acid phosphate esters, and a remainder of a polar organic solvent.

2. A resin-based flux as claimed in claim 1 wherein the acid phosphate esters are selected from acid phosphonate esters and acid phosphinate esters.

3. A resin-based flux as claimed in claim 1 wherein the acid phosphate esters are selected from di(2-ethylhexyl) phosphonate, diethyl (p-methylbenzyl) phosphonate, di(isodecyl) phosphonate, mono-2-ethylhexyl phosphinate, and di(2-ethylhexyl) phosphate.

4. A resin-based flux as claimed in claim 1 which contains 0.2-2 mass % of the at least one compound selected from acid phosphate esters.

5. A resin-based flux as claimed in claim 1 which contains 0.2-1 mass % of the at least one compound selected from acid phosphate esters.

6. A resin-based flux as claimed in claim 1 wherein the at least one compound selected from acid phosphate esters can form a complex with Sn in a lead-free solder during soldering of the lead-free solder to prevent oxidation of the Sn, the complex remaining after soldering to prevent formation of whiskers.

7. A resin-based flux as claimed in claim 1 which contains 3-40 mass % of the activator with respect to the resin.

8. A resin-based flux as claimed in claim 1 wherein the resin is an acrylic acid modified rosin.

9. A resin-based flux as claimed in claim 1 wherein the flux contains 70-99 mass % of the polar organic solvent.

10. A resin-based flux as claimed in claim 1 wherein a portion of the at least one compound selected from acid phosphate esters remains in flux residue after heating to 230-260° C.

11. A resin-based flux as claimed in claim 1 which contains 5-15 mass % of the resin, 0.5-3 mass % of the activator, 0.2-4 mass % of the at least one compound selected from acid phosphate esters, and 70-90 mass % of the polar organic solvent.

12. A solder paste comprising a lead-free solder powder mixed with a resin-based flux as claimed in claim 1.

13. A solder paste as claimed in claim 12 wherein a portion of the at least one compound selected from acid phosphate esters remains in flux residue after heating to 230-260° C.

14. A soldering method comprising performing soldering with a lead-free solder having Sn as a main component using a resin-based flux as claimed in claim 1 without carrying out cleaning of flux residue after soldering.

15. A soldering method as claimed in claim 14 wherein the soldering is carried out in a nitrogen atmosphere.

16. A soldering method as claimed in claim 14 wherein the acid phosphate esters are selected from acid phosphonate esters and acid phosphinate esters.

17. A method of preventing formation of whiskers on a soldered portion comprising soldering a lead-free solder having Sn as a main component to a copper surface in the presence of a resin-based flux as claimed in claim 1 without carrying out cleaning of flux residue after soldering.

\* \* \* \* \*